(12) United States Patent
Takimoto et al.

(10) Patent No.: US 12,720,677 B2
(45) Date of Patent: Aug. 25, 2026

(54) WIRING CIRCUIT BOARD AND WIRING CIRCUIT BOARD ASSEMBLY SHEET

(71) Applicant: NITTO DENKO CORPORATION, Osaka (JP)

(72) Inventors: Kenya Takimoto, Osaka (JP); Naoki Shibata, Osaka (JP); Hayato Takakura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 268 days.

(21) Appl. No.: 18/559,498

(22) PCT Filed: Jan. 28, 2022

(86) PCT No.: PCT/JP2022/003200
§ 371 (c)(1),
(2) Date: Nov. 7, 2023

(87) PCT Pub. No.: WO2022/239313
PCT Pub. Date: Nov. 17, 2022

(65) Prior Publication Data

US 2024/0244742 A1 Jul. 18, 2024

(30) Foreign Application Priority Data

May 13, 2021 (JP) ................................ 2021-081722

(51) Int. Cl.
*H05K 1/02* (2006.01)
*H05K 1/05* (2006.01)

(52) U.S. Cl.
CPC ............ *H05K 1/0296* (2013.01); *H05K 1/05* (2013.01); *H05K 2201/09927* (2013.01)

(58) Field of Classification Search
CPC ...... H05K 2201/09918; H05K 1/0266–1/0296
See application file for complete search history.

(56) References Cited

U.S. PATENT DOCUMENTS

2006/0078187 A1* 4/2006 Kudoh .................... H05K 1/16 257/E23.179
2016/0005665 A1 1/2016 Suzuki et al.
(Continued)

FOREIGN PATENT DOCUMENTS

CN 105244290 A 1/2016
JP H06-119736 A 4/1994
(Continued)

OTHER PUBLICATIONS

Office Action, issued by the Taiwanese Intellectual Property Office on Mar. 27, 2025, in connection with Taiwanese Patent Application No. 111104858.

(Continued)

*Primary Examiner* — Jeremy C Norris
(74) *Attorney, Agent, or Firm* — Edwards Neils LLC; Jean C. Edwards, Esq.

(57) ABSTRACT

A wiring circuit board includes a support metal layer; a base insulating layer disposed on at least one surface in the thickness direction of the support metal layer, and a wiring layer disposed on one surface in the thickness direction of the base insulating layer. A plurality of stripe grooves that extends along a predetermined direction orthogonal to the thickness direction and a plurality of recesses that sinks in the thickness direction of the support metal layer are formed on one surface in the thickness direction and/or the other surface in the thickness direction of the support metal layer. The recesses form a two-dimensional code having a generally rectangular shape in plan view by means of a dot pattern. One side of the two-dimensional code is disposed so as to lie along the stripe grooves.

10 Claims, 4 Drawing Sheets

(56) References Cited

U.S. PATENT DOCUMENTS

2017/0273175 A1 9/2017 Obinata et al.
2018/0312432 A1* 11/2018 Horiuchi .............. H05K 3/0029

FOREIGN PATENT DOCUMENTS

| | | | |
|---|---|---|---|
| JP | H10-326950 | A | 12/1998 |
| JP | 2007-073863 | A | 3/2007 |
| JP | 2011-124491 | A | 6/2011 |
| JP | 2015-127119 | A | 7/2015 |
| JP | 2016-103587 | A | 6/2016 |
| JP | 2017-168608 | A | 9/2017 |
| TW | 201614741 | A | 4/2016 |

OTHER PUBLICATIONS

International Preliminary Report on Patentability issued by WIPO on Nov. 14, 2023, in connection with International Patent Application No. PCT/JP2022/003200.
International Search Report issued in PCT/JP2022/003200 on Apr. 26, 2022.
Written Opinion issued in PCT/JP2022/003200 on Apr. 26, 2022.
Office Action, issued by the Korean Intellectual Property Office on Nov. 13, 2025, in connection with Korean Patent Application No. 10-2023-7037520.

* cited by examiner

First direction

Second direction

WIRING CIRCUIT BOARD AND WIRING CIRCUIT BOARD ASSEMBLY SHEET

CROSS-REFERENCE TO RELATED APPLICATIONS

The present application is a 35 U.S.C. 371 National Stage Entry of PCT/JP2022/003200, filed on Jan. 28, 2022, which claims priority from Japanese Patent Application No. 2021-081722, filed on May 13, 2021, the contents of all of which are herein incorporated by reference in their entirety.

TECHNICAL FIELD

The present invention relates to a wiring circuit board and a wiring circuit board assembly sheet.

BACKGROUND ART

Conventionally, two-dimensional codes are used in the management of wiring circuit boards. For example, the following metal-clad laminate has been proposed. This metal-clad laminate includes an insulating resin layer and a metal layer laminated on one surface of the insulating resin layer. Then, a generally square-shaped visibility evaluation portion including a two-dimensionally distributed dot pattern is provided in the metal layer (see, for example, Patent Document 1).

CITATION LIST

Patent Document

Patent Document 1: Japanese Unexamined Patent Publication No. 2015-127119

SUMMARY OF THE INVENTION

Problem to be Solved by the Invention

However, the metal layer may have stripe-shaped grooves by rolling or the like. When the visibility evaluation portion including the dot pattern is formed on this metal layer, overlaps between the grooves and the dots may cause poor recognition in the visibility evaluation portion.

More specifically, as referred to FIG. 5, when one side of the visibility evaluation portion and the stripe-shaped grooves intersect each other, the number of dots that overlap the grooves in at least a portion of the visibility evaluation portion becomes particularly high. In such a case, particularly many dots are difficult to recognize due to the interference of the grooves. As a result, recognition failure of the visibility evaluation portion is likely to occur.

The present invention provides a wiring circuit board and a wiring circuit board assembly sheet that can reduce recognition failure.

Means for Solving the Problem

The present invention [1] includes a wiring circuit board, including a support metal layer, an insulating layer disposed on at least one surface in the thickness direction of the support metal layer; and a wiring layer disposed on one surface in the thickness direction of the insulating layer, in which a plurality of stripe grooves that extends along a predetermined direction orthogonal to the thickness direction and a plurality of recesses that sinks in the thickness direction of the support metal layer are formed on one surface in the thickness direction and/or the other surface in the thickness direction of the support metal layer, and the recesses form a two-dimensional code having a generally rectangular shape in plan view by means of a dot pattern, and are disposed so that one side of the two-dimensional code lies along the stripe grooves.

In this wiring circuit board, the recesses are disposed so that one side of the two-dimensional code lies along the stripe grooves of the support metal layer. Therefore, the wiring circuit board can reduce the number of recesses that overlap the stripe grooves. As a result, according to the wiring circuit board, recognition failure of the two-dimensional code can be reduced.

The present invention [2] includes the wiring circuit board described in [1], in which the recesses form a two-dimensional code having a generally rectangle shape in plan view by means of a dot pattern, and are disposed so that a short side of the two-dimensional code lies along the stripe grooves.

In this wiring circuit board, the recesses are disposed so that the short side of the two-dimensional code lies along the stripe grooves of the support metal layer. Therefore, the wiring circuit board can further reduce the number of recesses that overlap the stripe grooves. As a result, according to the wiring circuit board, recognition failure of the two-dimensional code can be particularly satisfactorily reduced.

The present invention [3] includes the wiring circuit board described in [1] or [2], in which the recess has a plan view size of 5 mm or less.

In this wiring circuit board, the recess has a plan view size of 5 mm or less. Therefore, according to the wiring circuit board, recognition failure of the two-dimensional code can be particularly satisfactorily reduced.

The present invention [4] includes the wiring circuit board described in any one of the above-described [1] to [3], in which the recess is a laser mark.

In this wiring circuit board, the recess is a laser mark. Therefore, the wiring circuit board has excellent productivity.

The present invention [5] includes a wiring circuit board assembly sheet, including the plurality of wiring circuit boards described in any one of the above-described [1] to [4].

In this wiring circuit board assembly sheet, the recesses are disposed so that one side of the two-dimensional code lies along the stripe grooves of the support metal layer. Therefore, according to the wiring circuit board assembly sheet, recognition failure of the two-dimensional code can be reduced.

The present invention [6] includes a wiring circuit board assembly sheet, including a plurality of wiring circuit boards, the wiring circuit board assembly sheet being provided with a support metal layer, the wiring circuit board including the support metal layer; an insulating layer disposed on at least one surface in the thickness direction of the support metal layer; and a wiring layer disposed on one surface in the thickness direction of the insulating layer, in which in a portion not included in the wiring circuit board, a plurality of stripe grooves that extends along a predetermined direction orthogonal to the thickness direction and a plurality of recesses that sinks in the thickness direction of the support metal layer are formed on one surface in the thickness direction and/or the other surface in the thickness direction of the support metal layer, and the recesses form a two-dimensional code having a generally rectangular shape in plan view by means of a dot pattern, and are disposed so that one side of the two-dimensional code lies along the stripe grooves.

In this wiring circuit board assembly sheet, the recesses are disposed so that one side of the two-dimensional code lies along the stripe grooves of the support metal layer. Therefore, according to the wiring circuit board assembly sheet, recognition failure of the two-dimensional code can be reduced.

Effects of the Invention

In the wiring circuit board and the wiring circuit board assembly sheet according to the present invention, the recesses are disposed so that one side of the two-dimensional code lies along the stripe groove of the support metal layer. Therefore, according to the wiring circuit board and wiring circuit board assembly sheet of the present invention, recognition failure can be reduced.

DESCRIPTION OF THE EMBODIMENTS

Figure 1:
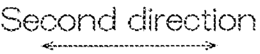
FIG. 1 is a sectional view of an embodiment of a wiring circuit board of the present invention.
Figure 1:
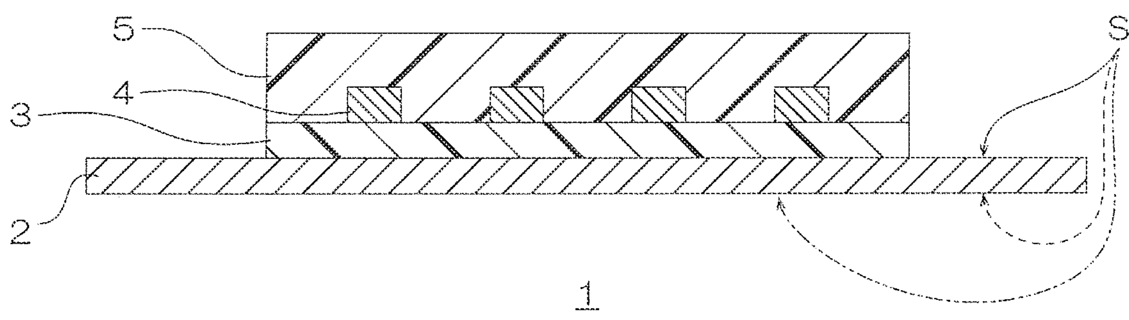

A wiring circuit board 1 has one surface and the other surface in the thickness direction facing each other in the thickness direction. The wiring circuit board 1 has a shape extending in a plane direction orthogonal to the thickness direction.

In the following, one surface in the thickness direction may be referred to as the front surface. The other surface in the thickness direction may be referred to as the back surface. Further, a predetermined one direction (a depth direction of the paper plane in FIG. 1) among the plane directions orthogonal to the thickness direction may be referred to as a first direction. In addition, a direction orthogonal to the first direction in the plane direction (right-left direction of the paper plane in FIG. 1) may be referred to as a second direction.

The wiring circuit board 1 includes a support metal layer 2, a base insulating layer 3 as an example of an insulating layer, a wiring layer 4, and a cover insulating layer 5.

The support metal layer 2 is a support plate that supports the wiring circuit board 1. As referred to FIG. 1, the support metal layer 2 is a flat plate member made of metal. More specifically, the support metal layer 2 has a generally flat plate shape extending in the plane direction.

Examples of a material of the supporting metal layer 2 include metal. Examples of the metal include copper, copper alloys, and stainless steel alloys, and preferably, copper and copper alloys are used.

The dimensions of the support metal layer 2 are appropriately set depending on the application and purpose. The support metal layer 2 has a thickness of, for example, 10 μm or more, preferably 15 μm or more. The thickness of the support metal layer 2 is, for example, 500 μm or less, preferably 250 μm or less.

Figure 4:
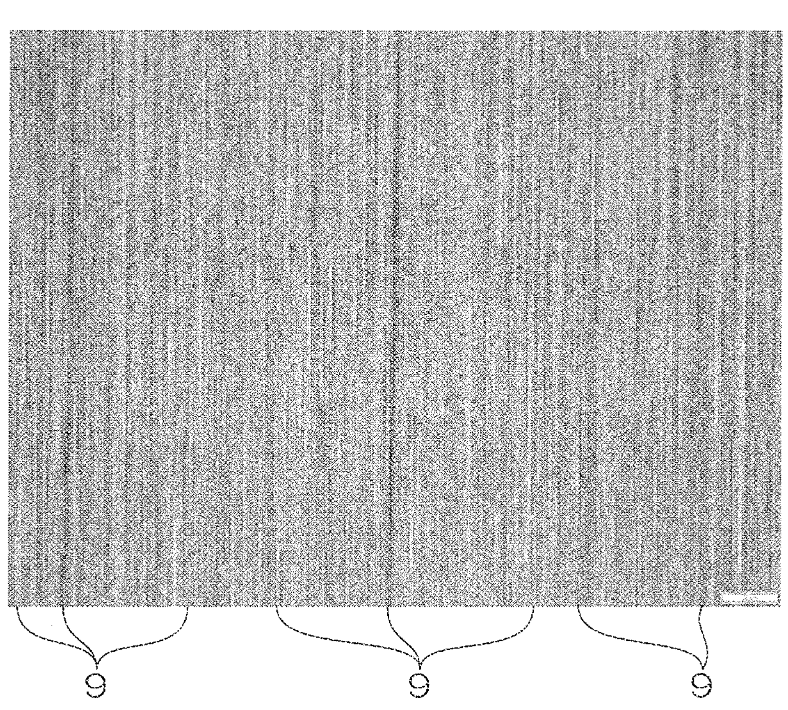
FIG. 4 is a plan view of the support metal layer of the wiring circuit board shown in FIG. 1.

As referred to FIG. 4, a plurality of stripe grooves 9 is formed on the front surface and/or back surface of the support metal layer 2.

The stripe groove 9 is a stripe-shaped groove. The stripe groove 9 is inevitably formed in the manufacturing of the support metal layer 2. For example, the support metal layer 2 is formed in a plate shape by rolling metal. In such a case, a rolled stripe as the stripe groove 9 is inevitably formed on the front surface and back surface of the support metal layer 2 during metal rolling.

As referred to FIG. 4, the stripe groove 9 extends along the first direction (the depth direction of the paper plane in FIG. 1 and the up-down direction of the paper plane in FIG. 4) that is orthogonal to the thickness direction of the support metal layer 2. The plurality of stripe grooves 9 is spaced apart from each other in the second direction (the right-left direction of the paper plane in FIG. 1 and the right-left direction of the paper plane in FIG. 4) that is orthogonal to the above-described first direction.

The stripe groove 9 has a depth of, for example, 0.1 μm or more, preferably 1 μm or more, more preferably 1.5 μm or more, even more preferably 2 μm or more, particularly preferably 2.5 μm or more. The depth of the stripe groove 9 is, for example, 30 μm or less, preferably 10 μm or less, more preferably 8 μm or less, even more preferably 6 μm or less, particularly preferably 5 μm or less.

The base insulating layer 3 is an insulating layer that insulates the wiring layer 4 and the support metal layer 2. As referred to FIG. 1, the base insulating layer 3 has a sheet shape extending along the plane direction. The base insulating layer 3 is disposed on the front surface of the support metal layer 2. The base insulating layer 3 may be disposed on the back surface of the support metal layer 2. Preferably, the base insulating layer 3 is disposed only on the front surface of the support metal layer 2.

More specifically, the base insulating layer 3 is disposed only on a portion of the front surface of the support metal layer 2. Thus, a remainder of the front surface of the support metal layer 2 is exposed from the base insulating layer 3. And, the entire back surface of the support metal layer 2 is exposed from the base insulating layer 3.

As described in detail below, in the support metal layer 2, a recess forming region S (described later) is demarcated in a portion exposed from the base insulating layer 3.

Examples of a material of the base insulating layer 3 include insulating resin. Examples of the insulating resin include polyimide. The base insulating layer 3 has a thickness of, for example, 1 μm or more, preferably 3 μm or more. The thickness of the base insulating layer 3 is, for example, 35 μm or less.

The wiring layer 4 is, for example, a metal layer that transmits an electrical signal. As referred to FIG. 1, the wiring layers 4 are disposed on the front surface of the base insulating layer 3. Terminals (not illustrated) are connected to both end edges in the first direction (the depth direction of the paper plane in FIG. 1) of the wiring layers 4. The wiring layers 4 are disposed in parallel so as to be spaced apart from each other in the second direction (the right-left direction of the paper plane in FIG. 1).

Examples of a material of the wiring layer 4 include metal. Examples of the metal include copper, copper alloys, and stainless steel alloys, and preferably, copper and copper alloys are used.

The wiring layer 4 has a thickness of, for example, 1 μm or more, preferably 3 μm or more. The thickness of the wiring layer 4 is, for example, 50 μm or less, preferably 30 μm or less. The wiring layer 4 has a length in the second direction of, for example, 5 μm or more, preferably 8 μm or more. The length in the second direction of the wiring layer 4 is, for example, 100 μm or less, preferably 50 μm or less. A spacing between adjacent wiring layers 4 is appropriately set depending on the application of the wiring circuit board 1.

The cover insulating layer 5 is an insulating layer that protects the front surfaces of the wiring layer 4. As referred to FIG. 1, the cover insulating layer 5 is disposed on the front surface of the base insulating layer 3 so as to cover the wiring layer 4. More specifically, the cover insulating layer 5 is in contact with the front surface and side surface of the wiring layer 4.

The cover insulating layer 5 is in contact with the front surface of the base insulating layer 3 around the wiring layer 4. Examples of a material of the cover insulating layer 5 include the above-described insulating resin. Both end edges in the first direction of the wiring layers 4 are exposed from the cover insulating layer 5.

The cover insulating layer 5 has a thickness of, for example, 2 μm or more, preferably 4 μm or more. The thickness of the cover insulating layer 5 is, for example, 60 μm or less, preferably 40 μm or less.

Figure 2:
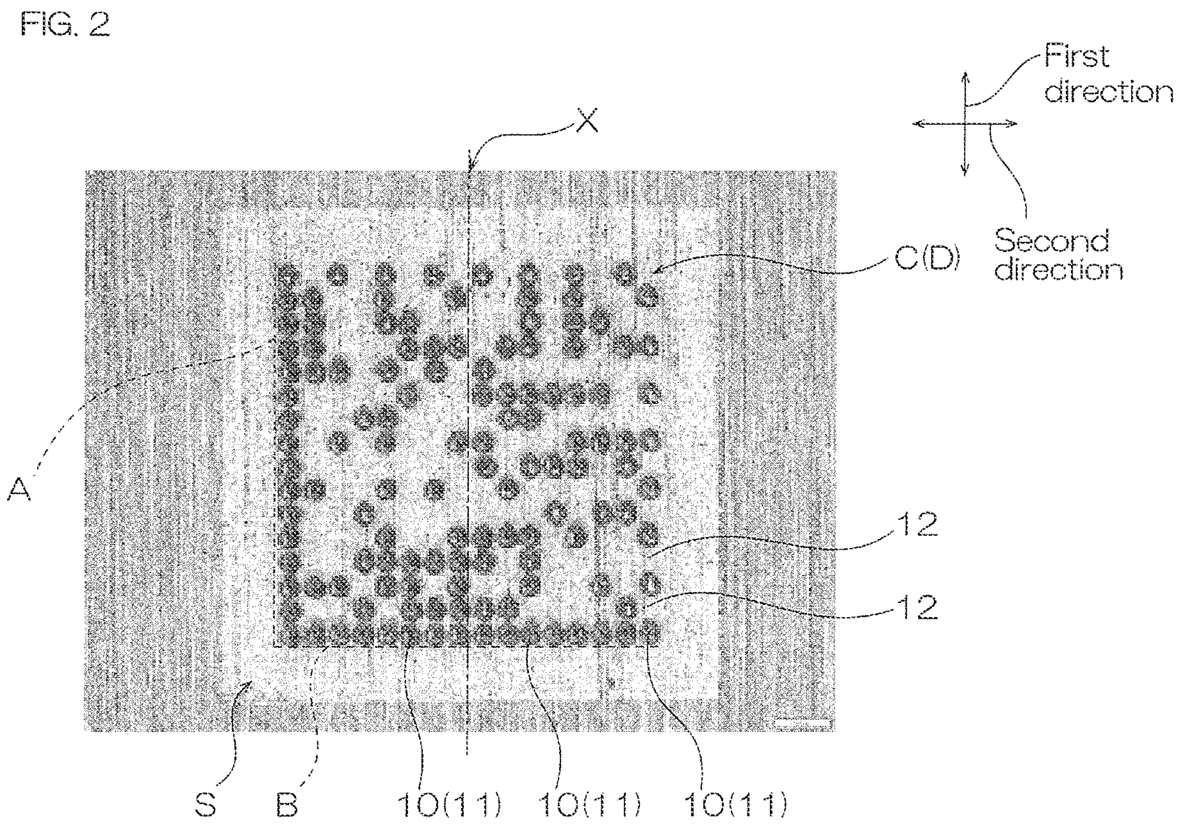
FIG. 2 is a plan view of one form of a two-dimensional code of the wiring circuit board shown in FIG. 1, the two-dimensional code having a generally square shape in plan view and having one side lying along a stripe groove of a support metal layer.
Figure 3:
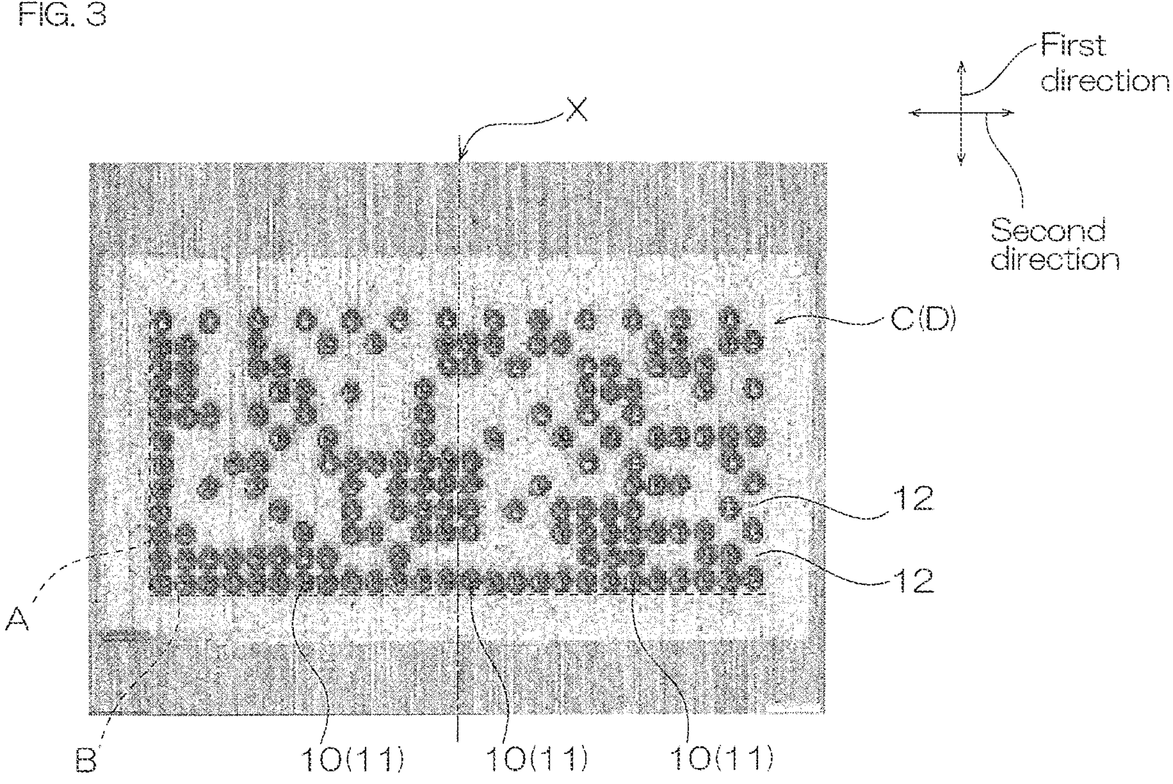
FIG. 3 is a plan view of another form of the two-dimensional code of the wiring circuit board shown in FIG. 1, the two-dimensional code having a generally rectangle shape in plan view and having a short side lying along the stripe groove of the support metal layer.

As referred to FIGS. 2 and 3, a plurality of recesses 10 are provided in the wiring circuit board 1. Each of the recesses 10 is a depression into which the support metal layer 2 is sunk in the thickness direction. In other words, each of the recesses 10 is a non-through hole recessed downward from the upper surface of the support metal layer 2.

The recesses 10 are formed on the front surface and/or back surface of the support metal layer 2. More specifically, the recesses 10 are formed in the recess forming region S of the support metal layer 2.

The recess forming region S is, for example, a region demarcated in the portion exposed from the base insulating layer 3 on the front surface and/or back surface of the support metal layer 2. The recess forming region S is preferably demarcated in the support metal layer 2, on the side (front surface) where the base insulating layer 3 and the wiring layer 4 are formed. The recess forming region S has a generally rectangular shape in plan view larger than the shape of a two-dimensional code C (described later). The recess forming region S is preferably subjected to a surface smoothing treatment from the viewpoint of suppressing recognition failure of the two-dimensional code C (described later).

In the surface smoothing treatment, for example, a surface roughness Ra and the maximum height Rz of the support metal layer 2 (recess forming region S) are adjusted in predetermined ranges. Examples of a surface smoothing treatment method include chemical etching and laser irradiation methods. From the viewpoint of production efficiency of the wiring circuit board 1, a laser irradiation method is preferably used.

In the laser irradiation method, laser light is irradiated toward the support metal layer 2 from above the support metal layer 2. Examples of the laser light include solid-state laser light, liquid laser light, and gas laser light, and preferably, solid-state laser light is used. Examples of the laser light include the laser lights described in paragraph numbers [0041] to [0046] of Japanese Unexamined Patent Publication No. 2011-124491. Thus, surface smoothing of the support metal layer 2 can be achieved.

The surface roughness (arithmetic average roughness) Ra of the recess forming region S is, for example, 0.01 μm or more, preferably 0.05 μm or more, more preferably 0.10 μm or more. The surface roughness (arithmetic average roughness) Ra of the recess forming region S is, for example, 1.0 μm or less, preferably 0.5 μm or less, more preferably 0.3 μm or less. The surface roughness Ra is measured by a non-contact type surface roughness meter in accordance with JIS B 0601 (1994). When the surface roughness Ra of the recess forming region S is within the above-described range, recognition failure of the two-dimensional code C (described later) can be further suppressed.

The maximum height Rz of the recess forming region S is, for example, 0.1 μm or more, preferably 0.5 μm or more. The maximum height Rz of the recess forming region S is, for example, 10 μm or less, preferably 5.0 μm or less, more preferably 3.0 μm or less. The maximum height Rz is measured by a non-contact type surface roughness meter in accordance with JIS B 0601 (1994). When the maximum height Rz of the recess forming region S is within the above-described range, recognition failure of the two-dimensional code C (described later) can be further suppressed.

Examples of a method for forming the recesses 10 in the recess forming region S include chemical etching and laser irradiation methods. From the viewpoint of production efficiency of the wiring circuit board 1, a laser irradiation method is preferably used.

In the laser irradiation method, laser light is irradiated toward the recess forming region S from above the recess forming region S. Examples of the laser light include solid-state laser light, liquid laser light, and gas laser light, and preferably, solid-state laser light is used. Examples of the laser light include the laser lights described in paragraph numbers [0041] to [0046] of Japanese Unexamined Patent Publication No. 2011-124491.

When the laser light is irradiated, the support metal layer 2 sinks in the thickness direction in the recess forming region S. As a result, the recesses 10 having desired shapes and sizes are formed. In such a case, the recesses 10 are laser marks. When the recesses 10 are laser marks, the wiring circuit board 1 has excellent productivity.

The recess 10 has, for example, a generally circular or square shape in plan view. The recess 10 preferably has a generally circular shape in plan view. The plan view size and depth of the recess 10 are not particularly limited and are appropriately set depending on the purpose and application.

The plan view size of the recess 10 is, for example, 0.001 mm or more, preferably 0.005 mm or more, more preferably 0.01 mm or more, even more preferably 0.03 mm or more, particularly preferably 0.05 mm or more. The plan view size of the recess 10 is, for example, 5 mm or less, preferably 1 mm or less, more preferably 0.5 mm or less. When the plan view size of the recess 10 is within the above-described range, recognition failure of the two-dimensional code C can be particularly satisfactorily reduced. When the plan view size of the recess 10 is within the above-described range, the two-dimensional code C can be disposed in a small space in the wiring circuit board 1, thus enabling downsizing of the wiring circuit board 1.

The plan view size is a diameter of the recess 10 in plan view, for example, when the recess 10 has a generally circular shape in plan view. The plan view size is a length of one side of the recess 10 in plan view when the recess 10 has a generally square shape in plan view.

The recess 10 has a depth of, for example, 0.1 μm or more, preferably 1 μm or more, more preferably 1.5 μm or more, even more preferably 2 μm or more, particularly preferably 2.5 μm or more. The depth of the recess 10 is, for example, 30 μm or less, preferably 10 μm or less, more preferably 8 μm or less, even more preferably 6 μm or less, particularly preferably 5 μm or less. When the depth of the recess 10 is within the above-described range, recognition failure of the two-dimensional code C can be particularly satisfactorily reduced.

The ratio of the depth of the recess 10 to the depth of the stripe groove 9 (depth of the recess 10/depth of the stripe groove 9) is, for example, 0.01 or more, preferably 0.1 or more, and for example, 10 or less, preferably 5 or less. When the ratio of the depth of the recess 10 to the depth of the stripe groove 9 (depth of the recess 10/depth of the stripe groove 9) is within the above-described range, recognition failure of the two-dimensional code C can be particularly satisfactorily reduced.

The plurality of recesses 10 forms a dot pattern D. The dot pattern D is a pattern in which a concave dot 11 and a convex dot 12 are randomly arranged in any number of dots in a two-dimensional region having a generally rectangular shape in plan view.

The concave dot 11 is a portion where the recess 10 is formed in the two-dimensional region having a generally rectangular shape in plan view. The convex dot 12 is a portion where the recess 10 is not formed and that is protruded relative to the recess 10, in the two-dimensional region having a generally rectangular shape in plan view. The ratio of the concave dot 11 to the convex dot 12 is not particularly limited and is appropriately set.

The dot pattern D forms a known two-dimensional code C. That is, the plurality of recesses 10 forms a two-dimensional code C having a generally rectangular shape in plan view by means of the dot pattern D.

The two-dimensional code C is, for example, a code that can record arbitrary information as digital data. Examples of the information to be recorded in the two-dimensional code C include a manufacturing number, a manufacturing lot, product detailed information, and manufacturer information. The information recorded in the two-dimensional code C is readable by a known method based on, for example, the number and arrangement of dots.

Examples of the generally rectangular shape in plan view in the two-dimensional code C include, more specifically, a generally square shape in plan view and a generally rectangle shape in plan view. From the viewpoint of suppressing recognition failure of the two-dimensional code C, a generally rectangle shape in plan view is more preferred.

More specifically, examples of the two-dimensional code C include a QR code (registered trademark), a CP code, a 2/4 modulation code, a 3/16 modulation code, a 5/9 modulation code, and a data matrix. Preferably, a QR code (registered trademark) and a data matrix are used.

In the wiring circuit board 1, the two-dimensional code C is disposed so that one side A thereof lies along the stripe groove 9. That is, each of the recesses 10 is formed and disposed in the recess forming region S so that one side A of the two-dimensional code C extends along the first direction in which the stripe groove 9 extends. Further, each of the recesses 10 is formed and disposed in the recess forming region S so that the other side B of the two-dimensional code C extends along the second direction orthogonal to the first direction.

More specifically, for example, when the two-dimensional code C has a generally square shape in plan view, each of the recesses 10 is disposed so that at least one of the sides A of the two-dimensional code C lies along the stripe groove 9 (see FIG. 2).

When the two-dimensional code C has a generally rectangle shape in plan view, each of the recesses 10 is disposed so that a short side A of the two-dimensional code C lies along the stripe groove 9 (see FIG. 3).

From the viewpoint of suppressing recognition failure of the two-dimensional code C, the two-dimensional code C preferably has a generally rectangle shape in plan view. Each of the recesses 10 is disposed so that the short side A of the two-dimensional code C lies along the stripe groove 9 (see FIG. 3).

Figure 5:
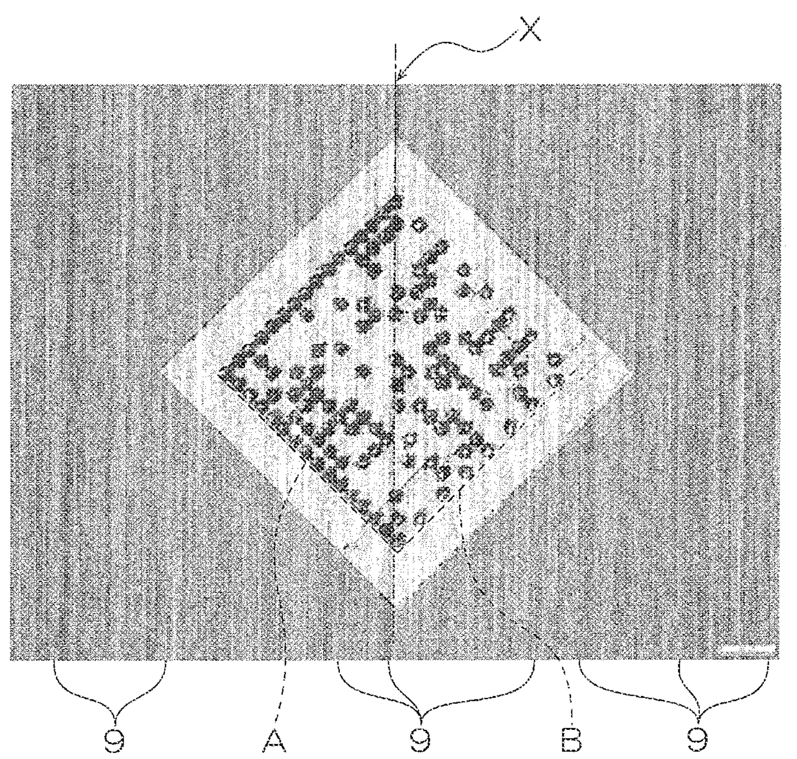
FIG. 5 is an example of a conventional two-dimensional code and is a plan view of a form in which the two-dimensional code has a generally square shape in plan view and has one side not lying along the stripe groove of the support metal layer.
Figure 5:
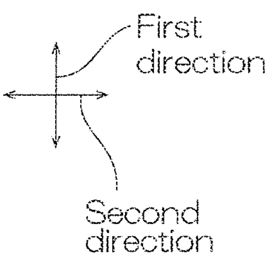

According to this wiring circuit board 1, recognition failure of the two-dimensional code C can be reduced. More specifically, as referred to FIG. 5, when one side A of the two-dimensional code C and the stripe groove 9 of the support metal layer 2 intersect each other, the numbers of the concave dots 11 and convex dots 12 that overlap the stripe groove 9 in at least a portion of the two-dimensional code C (see arrow X in FIG. 5) become particularly high. In such a case, particularly many concave dots 11 and convex dots 12 are difficult to recognize due to the interference of the stripe groove 9. As a result, recognition failure of the two-dimensional code C is likely to occur.

In contrast, as referred to FIGS. 2 and 3, the recesses 10 are formed and disposed in the recess forming region S so that one side A of the two-dimensional code C lies along the stripe groove 9 of the support metal layer 2. Therefore, in this wiring circuit board 1, the number of recesses 10 that overlap the stripe groove 9 can be reduced. As a result, according to the wiring circuit board 1, recognition failure of the two-dimensional code C can be reduced.

In particular, when the recesses 10 are disposed so that the short side A of the two-dimensional code C' lies along the stripe groove 9 of the supporting metal layer 2, the number of recesses 10 that overlap the stripe groove 9 can be further reduced. As a result, according to the wiring circuit board 1, recognition failure of the two-dimensional code C can be particularly satisfactorily reduced.

Furthermore, in the above-described wiring circuit board 1, when the plan view size of the recess 10 is 5 mm or less, dot reading failure by the stripe groove 9 can be suppressed and recognition failure of the two-dimensional code C can be particularly satisfactorily reduced.

In addition, when the recesses 10 are laser marks, the above-described wiring circuit board 1 has excellent productivity.

In the above description, the recess forming region S is demarcated in the portion exposed from the base insulating layer 3 on the support metal layer 2, and the two-dimensional code C is formed in the recess forming region S. That is, the recess forming region S and the two-dimensional code C do not overlap the base insulating layer 3 in a projection plane in the thickness direction of the support metal layer 2. However, the recess forming region S and the two-dimensional code C may overlap the base insulating layer 3 in the projection plane in the thickness direction of the support metal layer 2. That is, as indicated by a double-dashed-chain line in FIG. 1, the recess forming region S and the two-dimensional code C may be formed on the back surface of the support metal layer 2 so as to overlap the base insulating layer 3 in the thickness direction. Further, the recess forming region S and the two-dimensional code C may be formed on the back surface of the support metal layer 2 so as to overlap the wiring layer 4 in the thickness direction.

In the present invention, one two-dimensional code C may be formed for one wiring circuit board 1, or one two-dimensional code C may be formed for a plurality of wiring circuit boards 1.

More specifically, the wiring circuit board 1 may be included in a wiring circuit board assembly sheet. In this case, the wiring circuit board assembly sheet may have a plurality of two-dimensional codes C corresponding to the plurality of wiring circuit boards 1.

Figure 6:
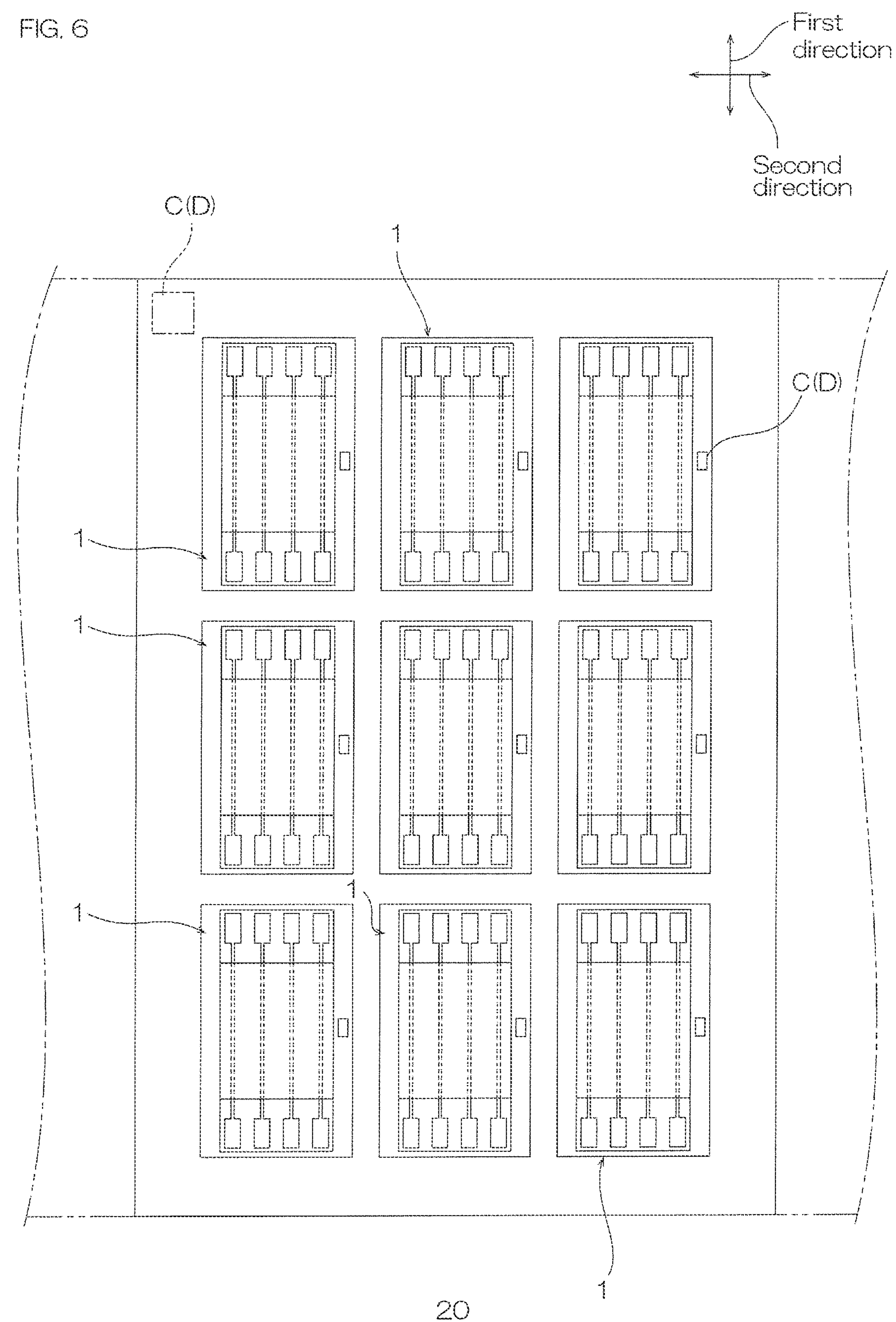
FIG. 6 is a plan view of one embodiment of a wiring circuit board assembly sheet including a plurality of wiring circuit boards shown in FIG. 1.

In FIG. 6, a wiring circuit board assembly sheet 20 has a generally rectangular shape extending in the plane direction. The wiring circuit board assembly sheet 20 is provided with the support metal layer 2. The wiring circuit board assembly sheet 20 is provided with the plurality of wiring circuit boards 1 including a portion of the support metal layer 2. The plurality of wiring circuit boards 1 is aligned and disposed so as to be spaced apart from each other in the wiring circuit board assembly sheet 20. In the wiring circuit board assembly sheet 20, the wiring circuit boards 1 are connected by joints (not shown) to the wiring circuit board assembly sheet 20 around the wiring circuit boards 1.

In this wiring circuit board assembly sheet, as referred to FIGS. 1 to 3, the recesses 10 are also formed and disposed in the recess forming region S so that one side A of the two-dimensional code C lies along the stripe groove 9 of the support metal layer 2. Therefore, the wiring circuit board assembly sheet 20 can also reduce the number of recesses 10 that overlap the stripe groove 9. As a result, according to the wiring circuit board assembly sheet 20, recognition failure of the two-dimensional code C can be reduced.

Furthermore, as referred in the phantom lines in FIG. 6, the wiring circuit board assembly sheet 20 may have only one two-dimensional code C for the plurality of wiring circuit boards 1.

That is, the wiring circuit board assembly sheet 20 is provided with the support metal layer 2. The wiring circuit board assembly sheet 20 is provided with the plurality of wiring circuit boards 1 including a portion of the support metal layer 2. And, each of the wiring circuit boards 1 included in the wiring circuit board assembly sheet 20 does not have a two-dimensional code C.

On the other hand, in the wiring circuit board assembly sheet 20, the recess forming region S is demarcated in the support metal layer 2 in a portion not included in the wiring circuit board 1, and the recesses 10 are formed in the recess forming region S. Thus, in the portion not included in the wiring circuit board 1, the two-dimensional code C is formed on the support metal layer 2.

In this wiring circuit board assembly sheet, as referred to FIGS. 1 to 3, the recesses 10 are also formed and disposed in the recess forming region S so that one side A of the two-dimensional code C lies along the stripe groove 9 of the support metal layer 2. Therefore, the wiring circuit board assembly sheet 20 can also reduce the number of recesses 10 that overlap the stripe groove 9. As a result, according to the wiring circuit board assembly sheet 20, recognition failure of the two-dimensional code C can be reduced.

The applications of the wiring circuit board 1 and the wiring circuit board assembly sheet 20 are not particularly limited and are used in various fields. The wiring circuit board 1 is, for example, a wiring circuit board for electronic equipment (wiring circuit board for electronic components) and a wiring circuit board for electrical equipment (wiring circuit board for electrical components). Examples of the wiring circuit boards for electronic equipment and for electrical equipment include wiring circuit boards for sensors, for vehicles, for video equipment, for communication relay equipment, for information processing terminals, for medical equipment, for electrical equipment, and for recording electronic equipment.

While the illustrative embodiments of the present invention are provided in the above-described invention, such is for illustrative purpose only and it is not to be construed restrictively. Modification and variation of the present invention that will be obvious to those skilled in the art is to be covered by the following claims.

INDUSTRIAL APPLICABILITY

The wiring circuit board and wiring circuit board assembly sheet of the present invention are suitably used in the fields of wiring circuit boards for electronic equipment and of wiring circuit boards for electrical equipment.

DESCRIPTION OF REFERENCE NUMERALS

- 1 wiring circuit board
- 2 support metal layer
- 3 base insulating layer
- 4 wiring layer
- 5 cover insulating layer
- 9 stripe groove
- 10 recess
- 20 wiring circuit board assembly sheet

The invention claimed is:

1. A wiring circuit board comprising:

a support metal layer;

an insulating layer disposed on at least one surface in the thickness direction of the support metal layer; and a wiring layer disposed on one surface in the thickness direction of the insulating layer, wherein a plurality of stripe grooves that extends along a predetermined direction orthogonal to the thickness direction and a plurality of recesses that sinks in the thickness direction of the support metal layer are formed on one surface in the thickness direction and/or the other surface in the thickness direction of the support metal layer, and wherein the recesses form a two-dimensional code having a generally rectangular shape in plan view by means of a dot pattern, and are disposed so that one side of the two-dimensional code lies along the stripe grooves.

2. The wiring circuit board according to claim 1, wherein the recesses form a two-dimensional code having a generally rectangle shape in plan view by means of a dot pattern, and are disposed so that a short side of the two-dimensional code lies along the stripe grooves.

3. The wiring circuit board according to claim 2, wherein the recess has a plan view size of 5 mm or less.

4. The wiring circuit board according to claim 3, wherein the recess is a laser mark.

5. The wiring circuit board according to claim 2, wherein the recess is a laser mark.

6. The wiring circuit board according to claim 1, wherein the recess has a plan view size of 5 mm or less.

7. The wiring circuit board according to claim 6, wherein the recess is a laser mark.

8. The wiring circuit board according to claim 1, wherein the recess is a laser mark.

9. A wiring circuit board assembly sheet comprising the plurality of wiring circuit boards described in claim 1.

10. A wiring circuit board assembly sheet comprising a plurality of wiring circuit boards, the wiring circuit board assembly sheet being provided with a support metal layer, the wiring circuit board comprising the support metal layer;

an insulating layer disposed on at least one surface in the thickness direction of the support metal layer; and a wiring layer disposed on one surface in the thickness direction of the insulating layer, wherein in a portion not included in the wiring circuit board, a plurality of stripe grooves that extends along a predetermined direction orthogonal to the thickness direction and a plurality of recesses that sinks in the thickness direction of the support metal layer are formed on one surface in the thickness direction and/or the other surface in the thickness direction of the support metal layer, and wherein the recesses form a two-dimensional code having a generally rectangular shape in plan view by means of a dot pattern, and are disposed so that one side of the two-dimensional code lies along the stripe grooves.

* * * * *